United States Patent
Ko et al.

(10) Patent No.: US 7,745,932 B2
(45) Date of Patent: Jun. 29, 2010

(54) SEMICONDUCTOR PACKAGE, SEMICONDUCTOR PACKAGE MODULE INCLUDING THE SEMICONDUCTOR PACKAGE, AND METHODS OF FABRICATING THE SAME

(75) Inventors: Jun-young Ko, Cheonan-si (KR); Dae-sang Chan, Asan-si (KR); Jae-yong Park, Cheonan-si (KR); Heui-seog Kim, Cheonan-si (KR); Wha-su Sin, Cheonan-Si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 12 days.

(21) Appl. No.: 12/153,558

(22) Filed: May 21, 2008

(65) Prior Publication Data

US 2008/0315408 A1    Dec. 25, 2008

(30) Foreign Application Priority Data

Jun. 20, 2007    (KR) .................. 10-2007-0060687

(51) Int. Cl.
*H01L 23/48*    (2006.01)
(52) U.S. Cl. ............................ 257/735; 257/E23.001
(58) Field of Classification Search ................ 257/735, 257/666, 686, 672, 673, E23.001
See application file for complete search history.

(56) References Cited

U.S. PATENT DOCUMENTS 5,808,877 A    9/1998    Jeong et al.
6,252,305 B1    6/2001    Lin et al.
6,353,265 B1    3/2002    Michii
6,433,421 B2    8/2002    Masuda et al.
6,900,528 B2    5/2005    Mess et al.
2006/0267173 A1    11/2006    Takiar et al.
2008/0054432 A1*    3/2008    Corisis et al. ............... 257/686

FOREIGN PATENT DOCUMENTS

| JP | 2002-231882 | 8/2002 |
| JP | 2005-150459 | 6/2005 |
| KR | 2004-0069392 | 8/2004 |
| KR | 2005-0049346 | 5/2005 |

OTHER PUBLICATIONS

Office Action dated Jun. 4, 2008 for corresponding Korean Application No. 10-2007-0060687.

* cited by examiner

*Primary Examiner*—Davienne Monbleau
*Assistant Examiner*—Hoa B Trinh
(74) *Attorney, Agent, or Firm*—Muir Patent Consulting, PLLC (57) ABSTRACT

Provided are a semiconductor package and a semiconductor package module including the same. The semiconductor package may include a plurality of semiconductor chips, a plurality of leads connected to pads of the semiconductor chips and externally exposed, wherein the plurality of leads may be classified into a plurality of pin groups, and the plurality of semiconductor chips may be classified into a plurality of chip groups, and the pads of the semiconductor chips of like chip groups may be connected to the leads of like pin groups.

39 Claims, 12 Drawing Sheets

SEMICONDUCTOR PACKAGE, SEMICONDUCTOR PACKAGE MODULE INCLUDING THE SEMICONDUCTOR PACKAGE, AND METHODS OF FABRICATING THE SAME

PRIORITY STATEMENT

This application claims priority under 35 U.S.C. §119 to Korean Patent Application No. 10-2007-0060687, filed on Jun. 20, 2007, in the Korean Intellectual Property Office (KIPO), the entire contents of which are herein incorporated by reference.

BACKGROUND

1. Field

Example embodiments relate to a semiconductor package, a semiconductor package module including the semiconductor package, and methods of fabricating the same. More particularly, example embodiments relate to a semiconductor package including leads that can be classified into a plurality of groups and in which a plurality of semiconductor chips are stacked, and a semiconductor package module in which the semiconductor package is mounted.

2. Description of the Related Art

Semiconductor package technology is continuously being developed in order to increase the integration and operating speed of semiconductor packages, and also to reduce the size and thickness of the semiconductor packages. Semiconductor packages may be formed such that one or more semiconductor chips are attached to a lead frame. Pads may be formed on the semiconductor chips and leads may be wire-bonded and sealed with an encapsulant, e.g., as epoxy molding compound (EMC). A flash memory, for example, may use a thin small outline package (TSOP) type semiconductor package, which has a relatively small thickness. A flash memory may also have a multi chip package (MCP) type semiconductor package, in which two or more semiconductor chips may be stacked when large capacity may not be provided using a single semiconductor chip. However, in a semiconductor package in which a plurality of semiconductor chips are stacked, the whole semiconductor package may be judged as being defective if any of the semiconductor chips are defective. The pin arrangement of leads is common to all the chips, and thus non-defective semiconductor chips and defective semiconductor chips are connected together to common leads corresponding to predetermined pin numbers.

Figure 1:
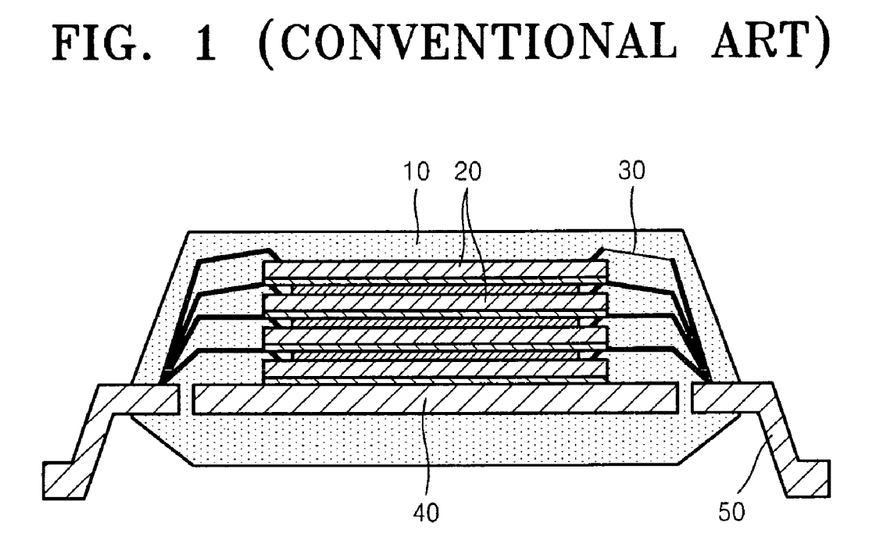
FIG. 1 is a side cross-sectional view of a prior art semiconductor package for comparison with example embodiments, including only one chip group and one pin group.
Figure 2:
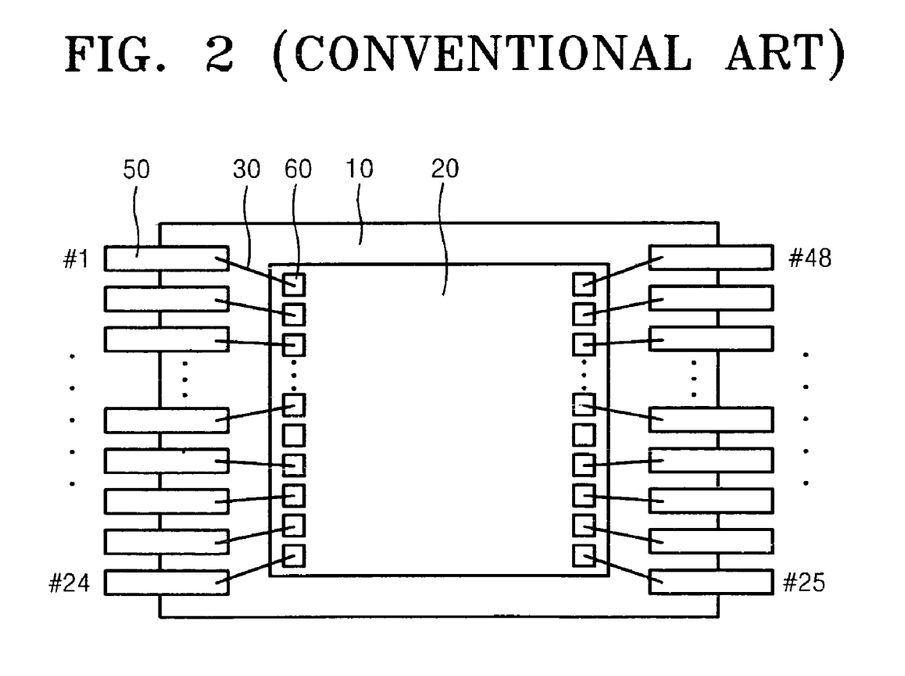
FIG. 2 is a plan view of an inner structure of the semiconductor package of FIG. 1.
Figure 3:
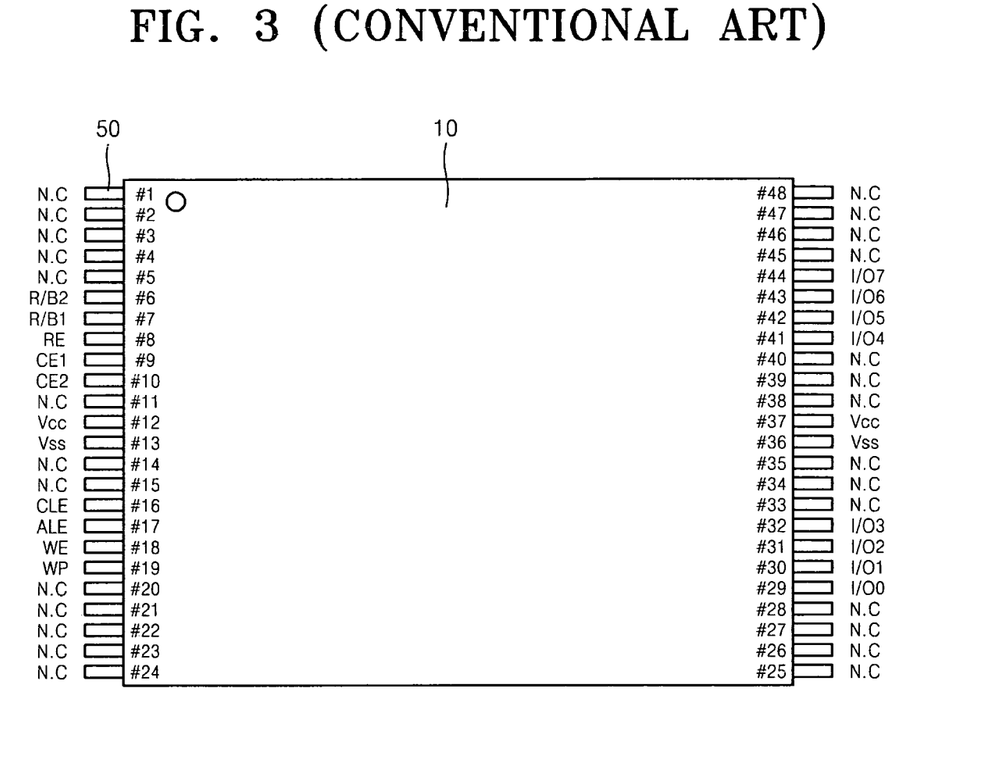
FIG. 3 is a plan view of the pin arrangement of the semiconductor package of FIG. 1.

FIG. 1 is a side cross-sectional view of a prior art semiconductor package including only one chip group and one pin group. FIG. 2 is a plan view of an inner structure of the semiconductor package of FIG. 1. FIG. 3 is a plan view of the pin arrangement of the semiconductor package of FIG. 1 in the case of a NAND flash memory.

Referring to FIGS. 1, 2, and 3, a plurality of semiconductor chips 20 may be stacked on a lead frame 40. Pads 60 may be formed adjacent to two side edges of each of the semiconductor chips 20 and leads 50 may be bonded using wires 30 to the pads 60. The semiconductor chips 20 may be sealed with an encapsulant 10, e.g., epoxy molding compound (EMC). The lead frame 40 and leads 50 may be a single body.

The semiconductor package illustrated in FIGS. 1, 2, and 3 may be a NAND flash memory, in the form of a thin small outline package (TSOP) type package, or a multi chip package (MCP) type package having 48 pins. The semiconductor package may include 48 leads 50, and the pin arrangement of the leads 50 is as illustrated in FIG. 3. Hereinafter, 'leads' and 'pins' refer to an identical term in respect of the structure and function thereof. #1, #2, etc. denote the pin number of the leads. The functions of the pins are denoted next to the pin numbers, meaning the type of power or signal that is transmitted through corresponding pins, and I/O, NC, R/B, CE, Vcc, Vss, Wp, and so on are illustrated. A NAND flash memory, as illustrated in FIGS. 1, 2, and 3, may be operated using eight I/O pins and five control clocks. Examples of pins denoting five control clocks include CLE, ALE, CE (CE1 and CE2), WE, and RE.

For example, pin #29 is an I/O 0 pin, and is connected to all four semiconductor chips 20. The I/O 0 pin displays a program/erase status in a NAND flash memory. Even if just one semiconductor chip 20 positioned right above the lead frame 40 among the four semiconductor chips 20 of FIG. 1 is defective, the whole semiconductor package may malfunction. Because all the semiconductor chips 20 in the semiconductor package are connected to one I/O 0 pin, the defective semiconductor chip 20 may not be separated from the I/O 0 pin that is common to all the semiconductor chips 20.

SUMMARY

Example embodiments provide a semiconductor package that may be used despite including a defective semiconductor chip, thereby increasing packaging yield, and a semiconductor package module in which the semiconductor package is mounted on a module substrate. Example embodiments also provide for a method of fabricating the semiconductor package.

According to example embodiments, a semiconductor package may include a plurality of semiconductor chips, a plurality of leads connected to pads of the semiconductor chips and externally exposed, wherein the leads may be classified into a plurality of pin groups, and the semiconductor chips may be classified into a plurality of chip groups, and the pads of the semiconductor chips in one chip group among the chip groups may be connected to the leads in one pin group among the pin groups.

According to example embodiments, a method of fabricating a semiconductor package may include forming a plurality of semiconductor chips, forming a plurality of pads on the semiconductor chips, forming a plurality of leads connected to pads of the semiconductor chips externally exposed wherein the leads may be classified into a plurality of pin groups, and the semiconductor chips may be classified into a plurality of chip groups, and connecting the pads of the semiconductor chips in one chip group among the chip groups to the leads in one pin group among the pin groups.

According to example embodiments, a semiconductor package module may include a semiconductor package and a module substrate on which the semiconductor package is mounted, wherein the semiconductor package may include a plurality of semiconductor chips, a plurality of leads connected to pads of the semiconductor chips and externally exposed wherein the leads may be classified into a plurality of pin groups, and the semiconductor chips may be classified into a plurality of chip groups, and the pads of the semiconductor chips in one chip group among the chip groups may be connected to the leads in one pin group among the pin groups.

According to example embodiments, a method of fabricating a semiconductor package module may include mounting a semiconductor package on a module substrate wherein the semiconductor package may include a plurality of semiconductor chips, a plurality of leads connected to pads of the semiconductor chips and externally exposed wherein the leads may be classified into a plurality of pin groups, and the semiconductor chips may be classified into a plurality of chip groups, and the pads of the semiconductor chips in one chip group among the chip groups may be connected to the leads in one pin group among the pin groups.

BRIEF DESCRIPTION OF THE DRAWINGS

Example embodiments will be more clearly understood from the following detailed description taken in conjunction with the accompanying drawings. FIGS. 4-17 represent non-limiting, example embodiments as described herein.

DETAILED DESCRIPTION OF EXAMPLE EMBODIMENTS

Example embodiments are described more fully hereinafter with reference to the accompanying drawings. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements of features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes of regions of elements and do not limit example embodiments.

Figure 4:
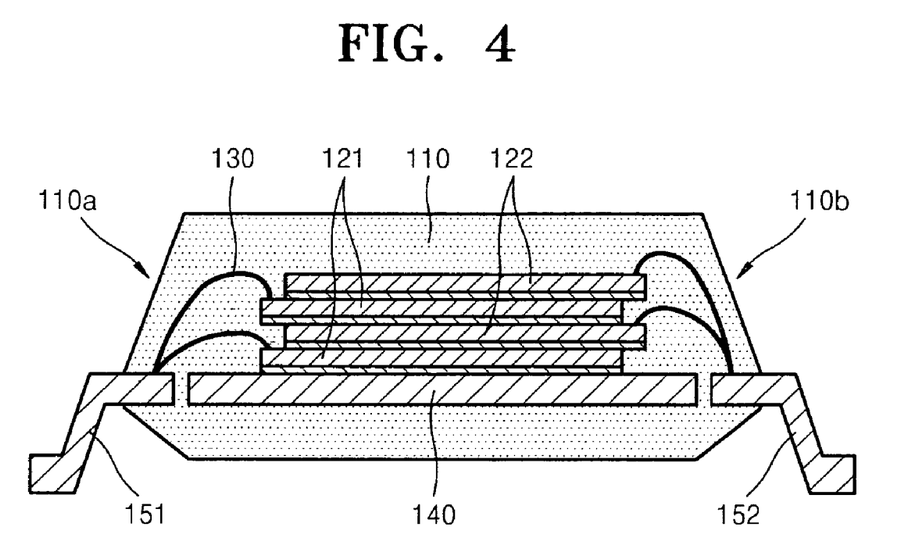
FIG. 4 is a side cross-sectional view of a semiconductor package according to example embodiments, wherein semiconductor chips may be stacked in a zigzag formation on an upper surface of a lead frame.
Figure 5:
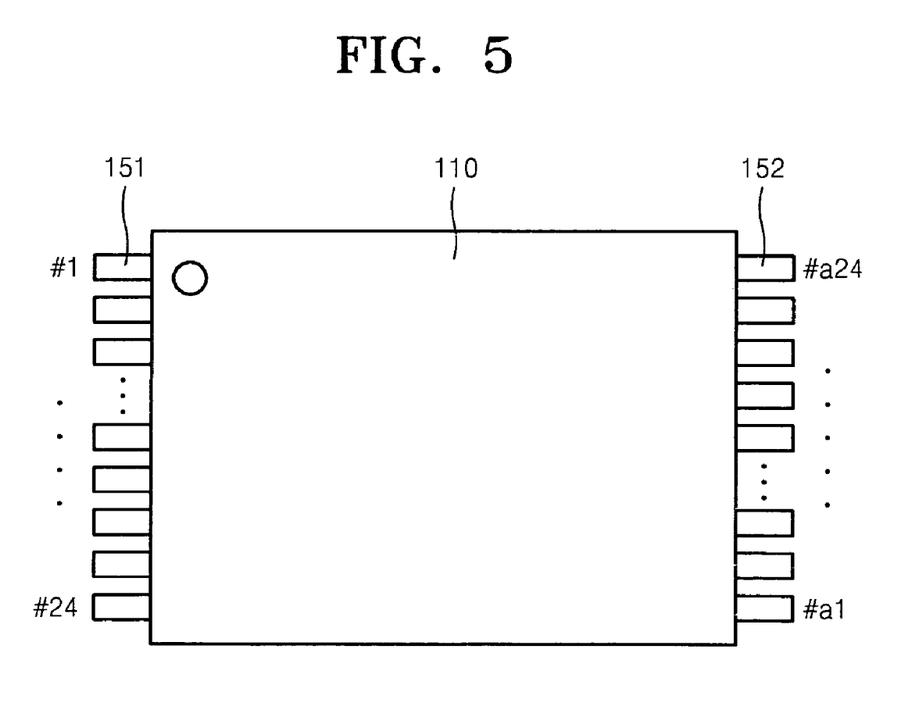
FIG. 5 is a plan view of the semiconductor package of FIG. 4, according to example embodiments.
Figure 6:
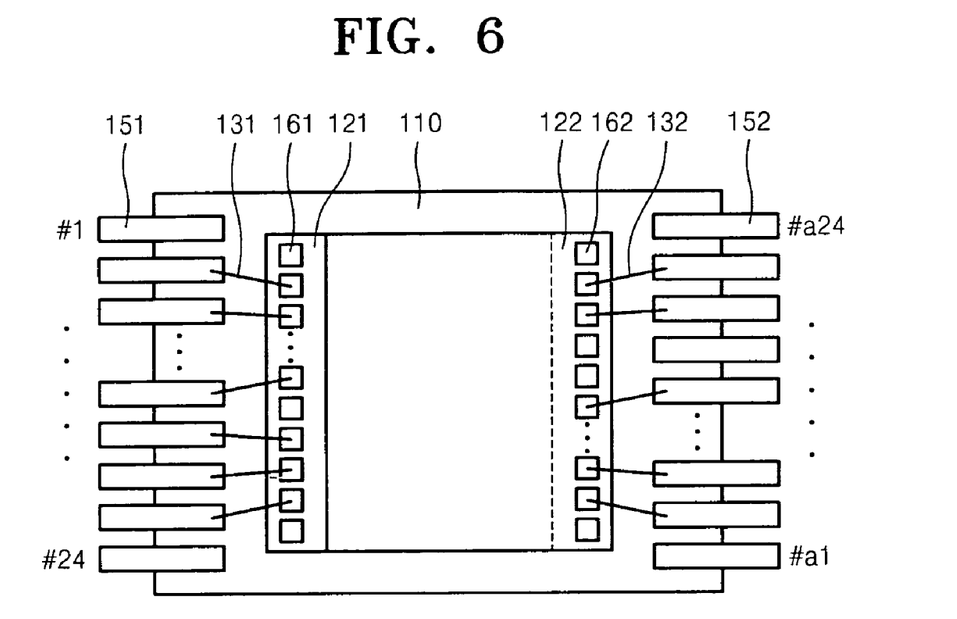
FIG. 6 is a plan view of an inner structure of the semiconductor package of FIG. 4, according to example embodiments.

FIG. 4 is a side cross-sectional view of a semiconductor package according to example embodiments, wherein semiconductor chips 121 and 122 may be stacked in a zigzag formation on an upper surface of a lead frame 140. FIG. 5 is a plan view of the semiconductor package of FIG. 4, according to example embodiments. FIG. 6 is a plan view of an inner structure of the semiconductor package of FIG. 4, according to example embodiments. Referring to FIGS. 4, 5 and 6, the semiconductor package, according to the example embodiments, may include leads 151 and 152 that may be classified into a plurality of pin groups, and semiconductor chips 121 and 122 that may be classified into several chip groups. The lead frame 140 and leads 151 and 152 may be a single body. Semiconductor chips 121 may be connected to a predetermined or given pin group and semiconductor chips 122 may be connected to another predetermined or given pin group. Thus, even if one of the semiconductor chips 121 connected to the predetermined or given pin groups is defective, other non-defective semiconductor chips 122 connected to other pin groups may be accessed, and thus the inefficiency of considering the whole semiconductor package as defective may be prevented or reduced.

Referring to FIGS. 4 and 5, the leads 151 exposed to a first side 110a of an encapsulant 110 may belong to a first pin group denoted by numbers #1 through #24, and the leads 152 exposed to a second side 110b of the encapsulant 110 may belong to a second pin group denoted by numbers #a1 through #a24. Four semiconductor chips 121 and 122 may be stacked in a zigzag formation on an upper surface of the lead frame 140, wherein the semiconductor chips 121 may be disposed in first and third positions from the lead frame 140, and the semiconductor chips 122 may be disposed in second and fourth positions from the lead frame 140. The semiconductor chips 121 may belong to a first chip group, and the semiconductor chips 122 may belong to a second chip group.

Referring to FIG. 6, pads 161 of the two semiconductor chips 121 which may belong to the first chip group may be connected to the leads 151 which may belong to the first pin group via wires 131, and pads 162 of the two semiconductor chips 122 which may belong to the second chip group may be connected to the leads 152 which may belong to the second pin group via wires 132. For example, pads of the semiconductor chips in a single chip group may be connected to the leads in a single pin group.

In addition, because it is efficient that all the semiconductor chips 121 and 122 in the semiconductor package have identical structure and form in respect of mass production, the semiconductor chips 121, which may belong to the first chip group, may have the same pad arrangement as the semiconductor chips 122 which may belong to the second chip group. Also, the pin groups may have the same pin arrangement.

However, example embodiments are not limited thereto, and the pin groups may have different pin arrangements, or the chip groups may have different pad arrangements. The semiconductor package may be realized when the semiconductor chips 121 are connected to the I/O 0 pin of the first pin group, and the semiconductor chips 122 are connected to the I/O 0 pin of the second pin group. For example, even when the arrangement order of the I/O pins of the first pin group and the arrangement order of the I/O pins of the second pin groups are different or when the pad arrangement of the semiconductor chips 121 belonging to the first chip group and that of the semiconductor chips 122 belonging to the second chip group are different, desired pads 161 and 162 may be connected to desired pins by adjusting the bonding position of the wires 131 and 132.

An upper surface or a lower surface of the semiconductor chips 121 and 122, on which the pads 161 and 162 may be attached, may be defined as a first surface, and a surface opposite to the first surface may be defined as a second surface, and the second surface of the semiconductor chips 121 and 122 may not cover the pads 161 and 162 formed on the first surface of the other semiconductor chips 121 and 122. The pads 161 and 162 may be located adjacent to one edge of the first surface, and the semiconductor chips 121 and 122 may be stacked in a zigzag formation to expose the pads 161 and 162. The semiconductor chips 121 and 122 may have an identical pad arrangement stacked in a zigzag formation adjacent to one edge of the first surface, the semiconductor chips 121 and 122 may be positioned in a point-symmetric structure, which overlaps each other when one is rotated 180 degrees.

Figure 10:
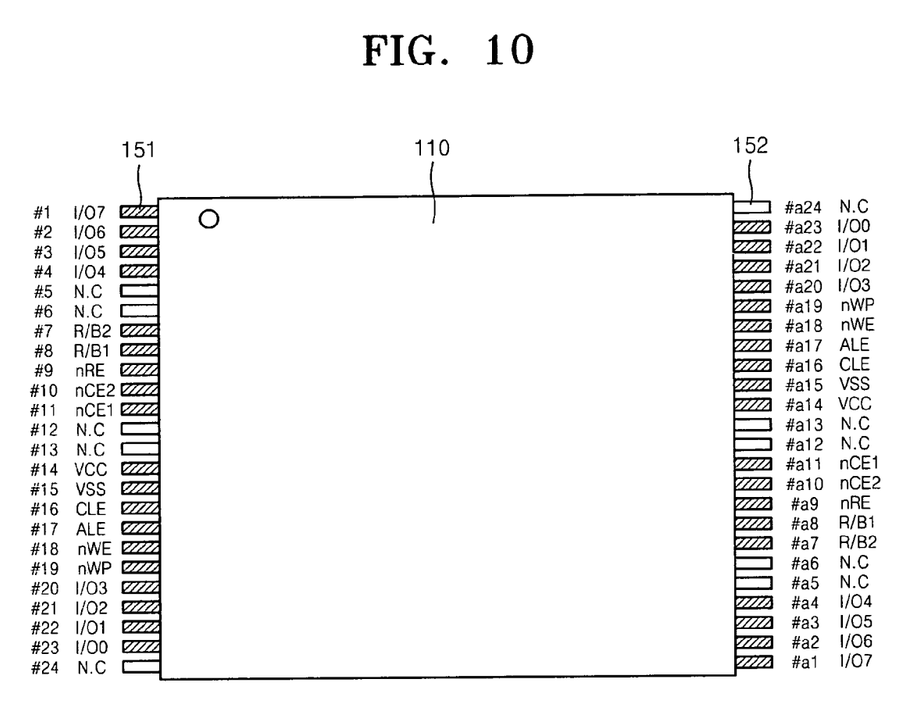
FIG. 10 is a plan view of the pin arrangement of the semiconductor package of FIG. 4, according to example embodiments.

FIG. 10 is a plan view of the pin arrangement of the semiconductor package of FIG. 4, according to example embodiments. Referring to FIGS. 4 and 10, the semiconductor chips 121 and 122 may be stacked on one of an upper surface and a lower surface of the lead frame 140. Further, the leads 151 may belong to a first pin group and may have a point-symmetric pin arrangement with the leads 152 belonging to a second pin group.

Figure 7:
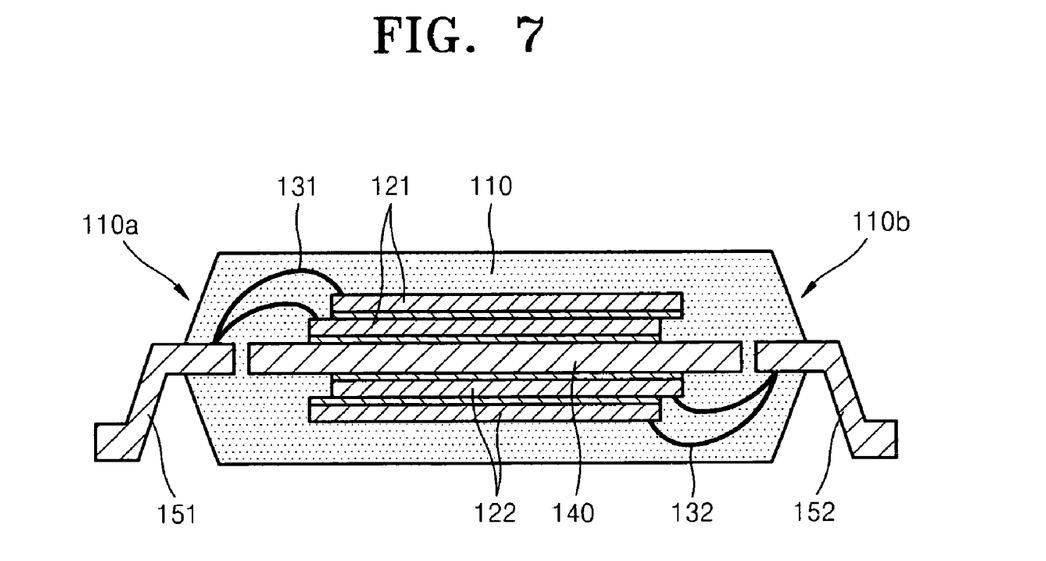
FIG. 7 is a side cross-sectional view of a semiconductor package according to example embodiments, including semiconductor chips on both surfaces of a lead frame.
Figure 8:
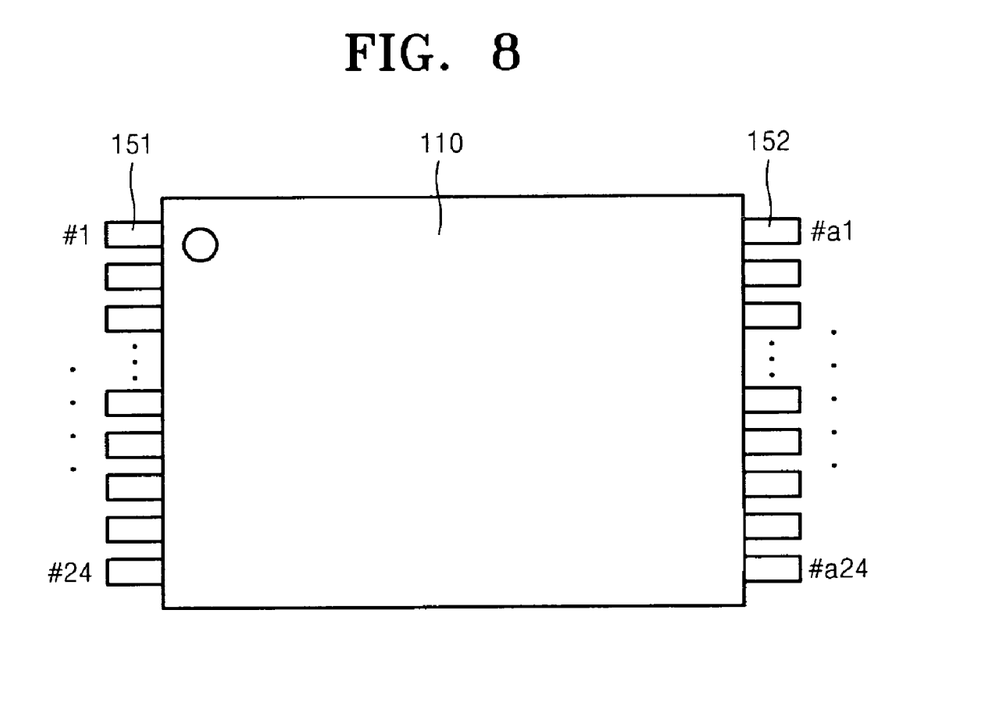
FIG. 8 is a plan view of the semiconductor package of FIG. 7, according to example embodiments.
Figure 9:
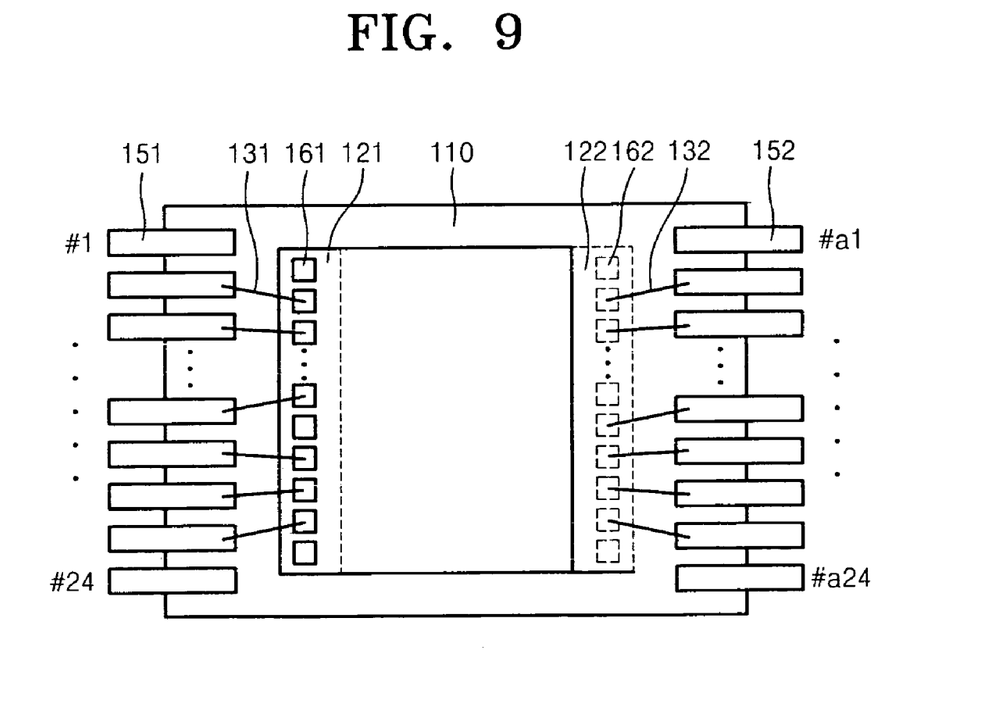
FIG. 9 is a plan view of an inner surface of the semiconductor package of FIG. 6, according to example embodiments.

FIG. 7 is a side cross-sectional view of a semiconductor package, according to example embodiments, including semiconductor chips 121 and 122 on both surfaces of a lead frame 140. FIG. 8 is a plan view of the semiconductor package of FIG. 7, according to example embodiments. FIG. 9 is a plan view of an inner surface of the semiconductor package of FIG. 7, according to example embodiments. Referring to FIGS. 7, 8, and 9, semiconductor chips 121 and 122 may be stacked on the upper surface and the lower surface of the lead frame 140. If the semiconductor chips 121 belonging to a first chip group of the upper surface of the lead frame 140 are turned over and rotated 180 degrees and is overlapped with the semiconductor chips 122 belonging to a second chip group of the lower surface of the lead frame 140, the arrangement of the semiconductor chips 121 and the semiconductor chips 122 may be identical to each other.

Figure 11:
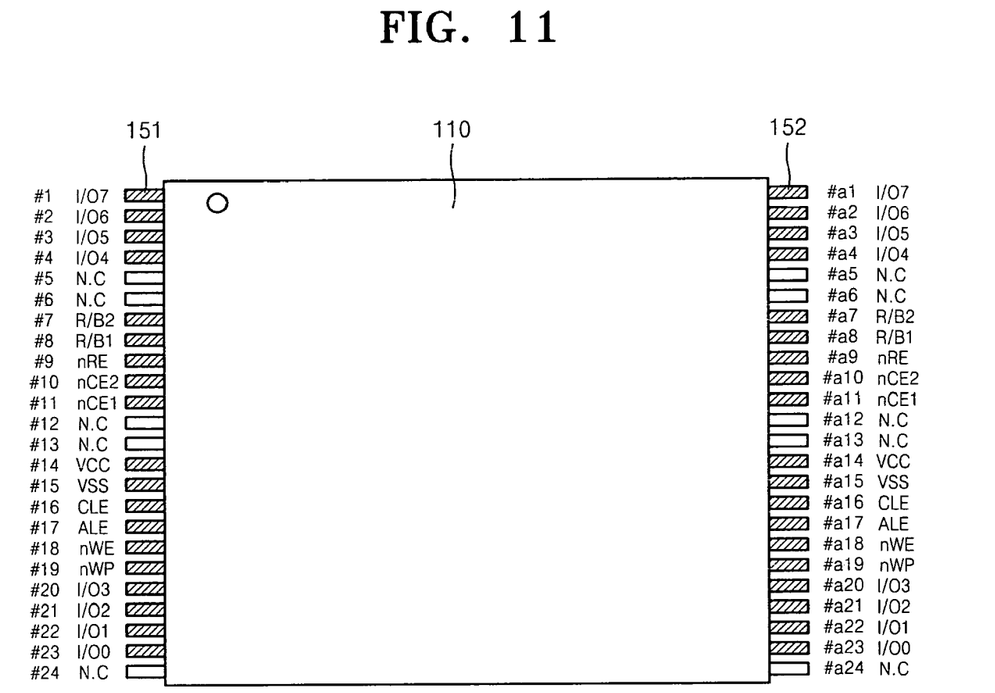
FIG. 11 is a plan view of the pin arrangement of the semiconductor package of FIG. 7, according to example embodiments.

FIG. 11 is a plan view of the pin arrangement of the semiconductor package of FIG. 7, according to example embodiments. Referring to FIG. 11, leads 151 belonging to the first pin group may have a line-symmetric pin arrangement with leads 152 belonging to the second pin group.

An I/O 0 pin may display a program/erase status. For example, in a NAND flash memory, I/O 0-I/O 7 pins may be arranged. For example, a value "0" of the I/O 0 pin may be defined as a successful program/erase(pass) status, and a value "1" of the I/O 0 pin may be defined as an error in program/erase(fail) status. The I/O 1-I/O 5 pins may be reserved for future use. The I/O 6 pin may display a device operation status. For example, a value "0" of the I/O 6 pin may be defined as a busy status, and a value "1" of the I/O 6 pin may be defined as a ready status. For example, a value "0" of the I/O 7 pin may be defined as a protected status, and a value "1" of the I/O 7 pin may be defined as a not-protected status.

A R/B pin may be a pin through which a ready/busy signal is transmitted. For example, when the R/B pin is defined to have a ready status, data may be input to and output from the semiconductor chip, and when the R/B pin is defined to have a busy status, data may not be input and output through the semiconductor chip.

A CE pin may be a chip select pin. For example, when two semiconductor chips are connected to one pin group, one of the semiconductor chips may be accessed by being selected by a CE1 pin, and the other semiconductor chip may be accessed by being selected by a CE2 pin.

A Vcc pin may be a pin to which a voltage of, for example, about 3.3 or about 5.0 V, is applied as a driving voltage for a NAND flash memory. The Vss pin may be a ground pin. A Wp pin may be a pin for forcible resetting.

An NC pin may be a No Select Pin, and may be a spare pin that is not electrically connected to the semiconductor chips. The arrangement and functions of various semiconductor pins are well known to those skilled in the art.

Example embodiments provide for a relatively low number of NC pins in comparison to prior art semiconductor packages. For example, in the prior art semiconductor package of FIG. 3, 26 NC pins may be provided, while in the semiconductor packages of FIGS. 10 and 11, merely 10 NC pins may be provided. There is a relation between the number of NC pins and the space required for arranging the pin groups, e.g., the greater the number of NC pins within a pin group, the greater the space required for arranging the pin group. Therefore, the size of a semiconductor package may be reduced by reducing the number of NC pins. Alternatively, the number of pin groups may be increased without increasing the size of the semiconductor package so long as the number of NC pins in the pin groups is reduced.

The semiconductor package according to example embodiments may have N pin groups according to the spare space, and is not limited to two pin groups. When N pin groups are provided, a maximum of N chip groups of semiconductor chips may be classified. Of course, N may be an integer greater than 1. The number of pin groups or chip groups may be related to the number of replaceable NC pins. Because a chip group including a defective semiconductor chip may not be used wholly, the yield of the semiconductor package may be increased as the number of the pin groups and the chip groups is increased.

The configuration and operation of a semiconductor package module according to example embodiments will be described with reference to FIGS. 12-15. The semiconductor package module according to example embodiments may include a semiconductor package mounted on a module substrate. The module substrate may be a means for substantial use of the semiconductor package and may be adaptively structured according to the structure of the pin groups. For example, a module substrate may be structured based on whether semiconductor package is point-symmetric or line-symmetric. The module substrate may also be adaptively structured in accordance with the presence of defective semiconductor chips included in the plurality of semiconductor chips.

Figure 12:
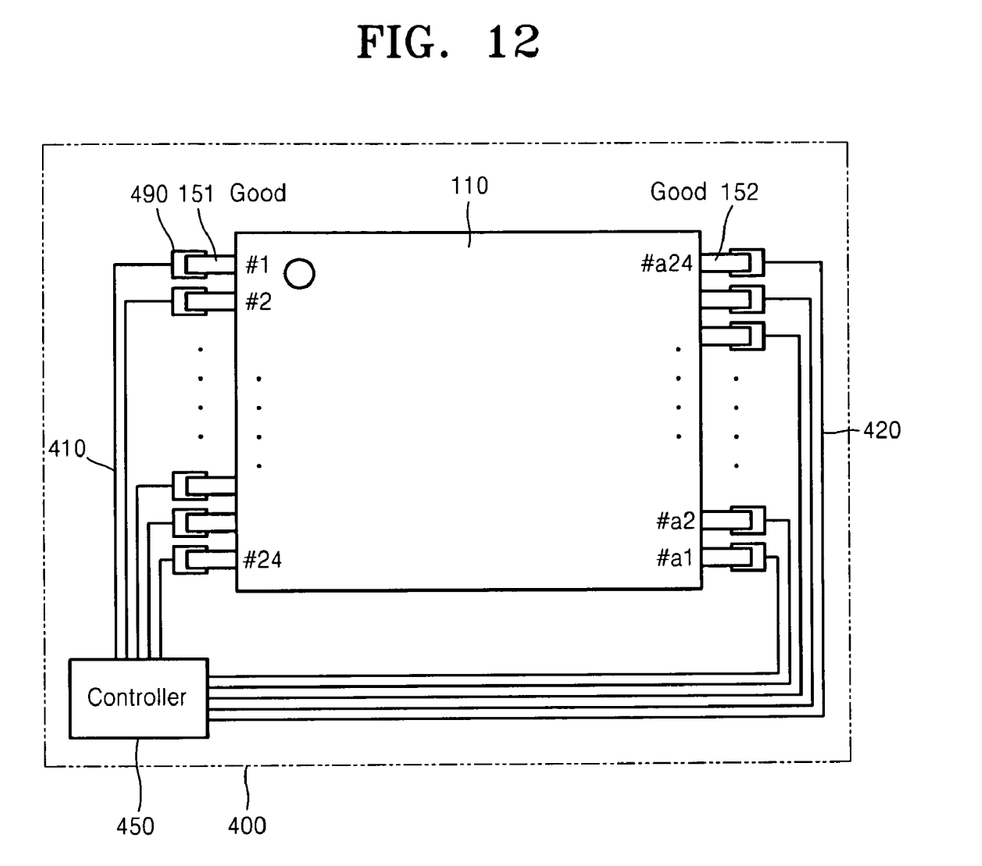
FIG. 12 is a plan view of a second module substrate in which the semiconductor package of FIG. 4 may be mounted, according to example embodiments.

FIG. 12 is a plan view of a second module substrate 400 in which the semiconductor package of FIG. 4 may be mounted, according to example embodiments. Referring to FIG. 12, the second module substrate 400 may include a first wiring 410 and a second wiring 420. The leads 151 may belong to a first pin group and may be connected to the first wiring 410 via land portions 490, and the leads 152 may belong to the second pin group and may be connected to the second wiring 420 via other land portions 490. A controller 450 may connect to the first wiring 410 and the second wiring 420 may control the operation of the semiconductor chips belonging to the first chip group and the second chip group. Although not illustrated in FIG. 12, third through N-th wirings may be added to the second module substrate 400, the third through N-th wirings may correspond to N chip groups which may be all non-defective. The second module substrate 400 may refer to a module substrate on which each of a plurality of pin groups may have a point-symmetric pin arrangement as semiconductor chips are stacked on one of an upper surface and a lower surface of a lead frame and each of a plurality of chip groups is non-defective.

Figure 13:
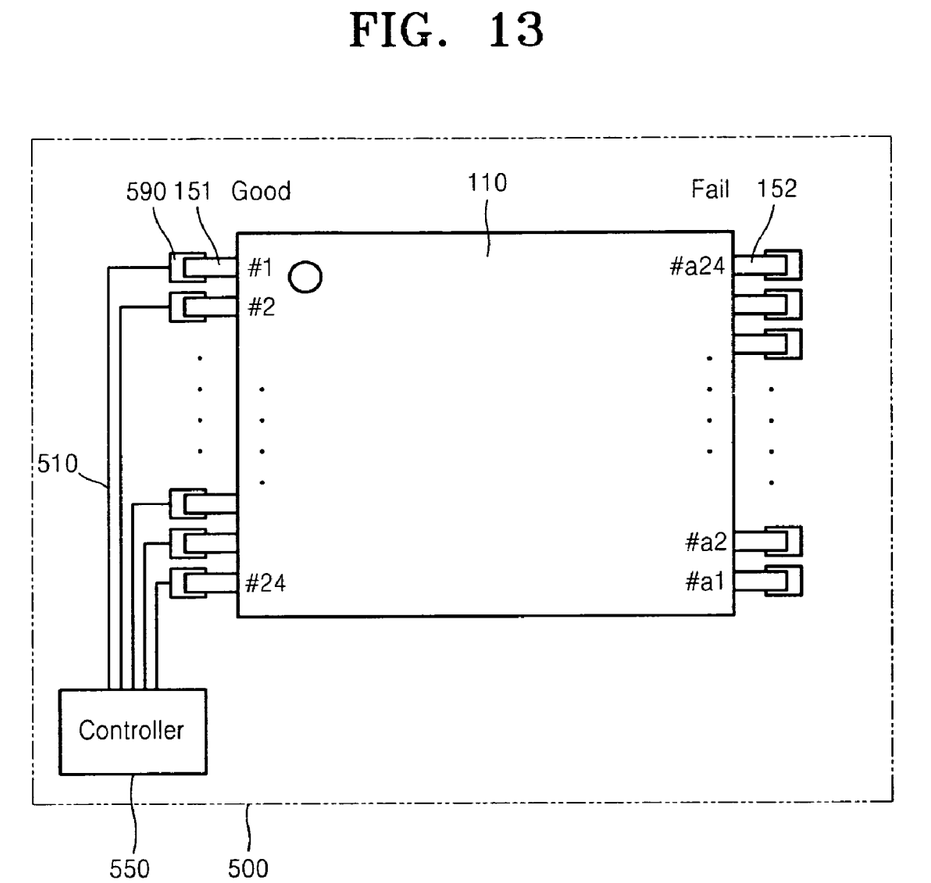
FIGS. 13 and 14 are plan views of a first module substrate in which the semiconductor package of FIG. 4 may be mounted, according to example embodiments.
Figure 14:
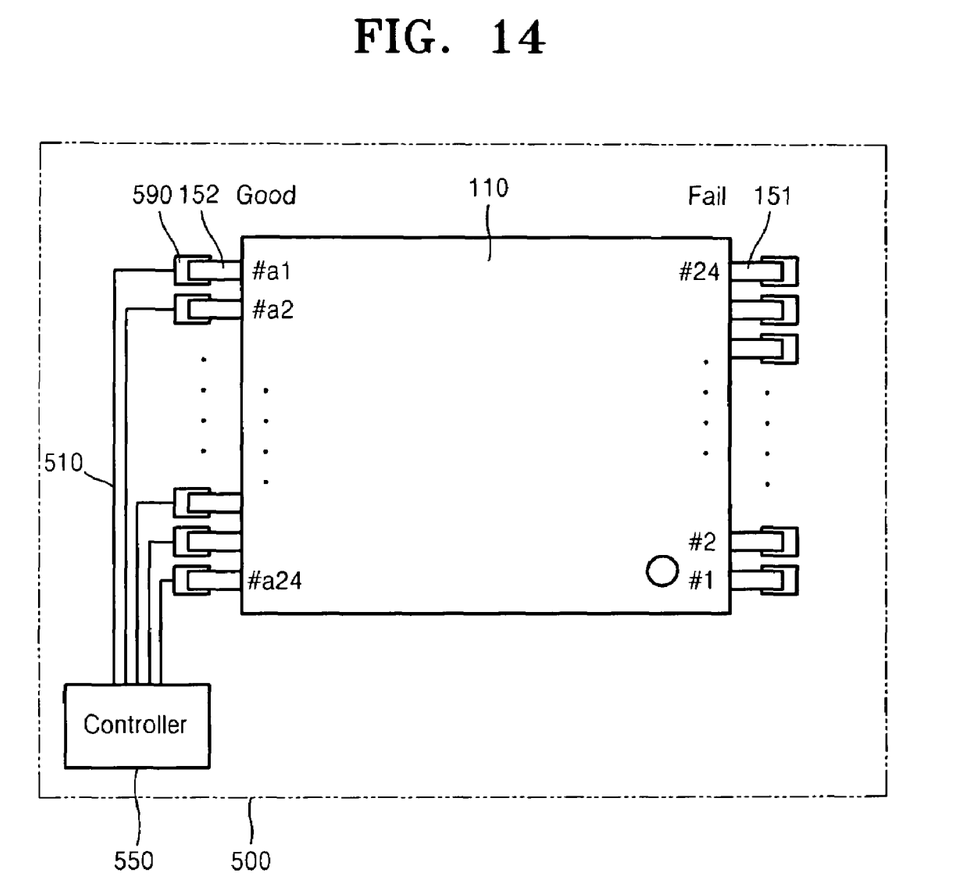

FIGS. 13 and 14 are plan views of a first module substrate 500 in which the semiconductor package of FIG. 4 may be mounted, according to example embodiments. The first module substrate 500 may include a first wiring 510. As described above, in the semiconductor package, a first chip group may be connected to a first pin group, and a second chip group may be connected to a second pin group.

Referring to FIG. 13, when at least one defective semiconductor chip is included in the second chip group, the leads 152 of the second pin group, to which the second chip group may be connected, may be isolated, and the leads 151 of the first pin group connected to the first chip group may be connected to the first wiring 510 via land portions 590, and the first chip group may be accessed by a controller 550.

Referring to FIG. 14, when at least one defective semiconductor chip is included in the first chip group, the leads 151 of the first pin group, to which the first chip group is connected, may be isolated, and the leads 152 of the second pin group connected to the second chip group may be connected to the first wiring 510 via land portions 590, and the second chip group may be accessed by the controller 550. By rotating the semiconductor package whose pin arrangement is point-symmetric, pin groups connected to non-defective chip groups may be aligned with the first wiring 510.

Although not illustrated in the drawings, the first module substrate 500 and the second module substrate 400 may be combined, and a module substrate corresponding to a semiconductor package whose m chip groups among N chip groups are defective, where m is an integer greater than 0 and smaller than N, may be designed. For example, m pin groups may be isolated, and N-m wirings may be provided, and N-m non-defective chip groups may be connected to the N-m wirings. The first module substrate 500 may be referred to a module substrate on which each of a plurality of pin groups may have a point-symmetric pin arrangement and defective chip groups may be present as semiconductor chips are stacked on an upper surface and a lower surface of a lead frame.

Figure 15:
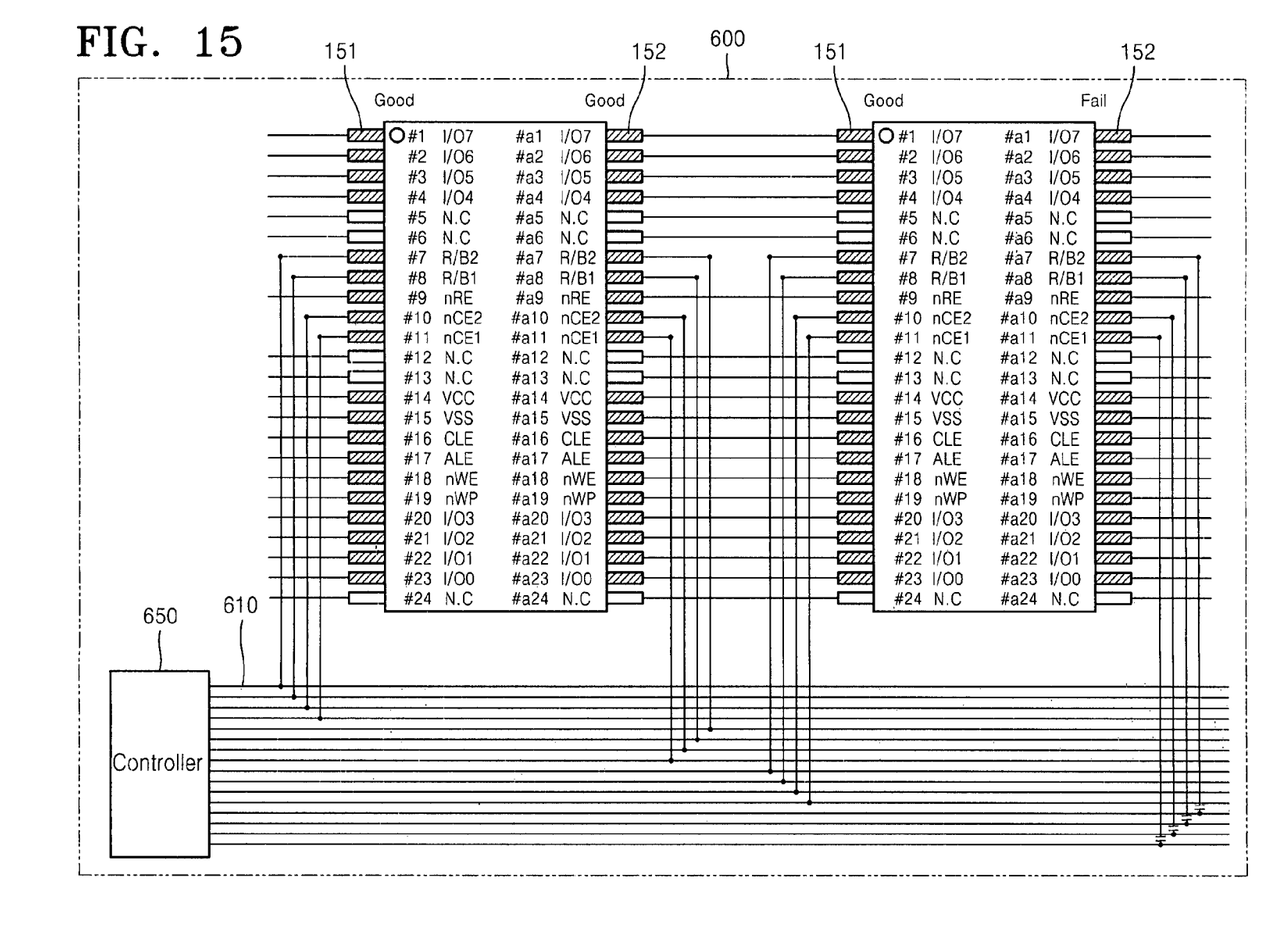
FIG. 15 is a plan view of a third module substrate in which the semiconductor package of FIG. 7 may be mounted, according to example embodiments.

FIG. 15 is a plan view of a third module substrate 600 in which the semiconductor package of FIG. 7 may be mounted, according to example embodiments. The third module substrate 600 may be a module substrate on which each of a plurality of pin groups may have a line-symmetric pin arrangement as semiconductor chips are stacked on both surfaces of a lead frame and thus may be used regardless of whether defective chip groups are present. A plurality of semiconductor packages may be mounted on the third module substrate 600. The third wirings 610 of the third module substrate 600 may connect identical pins to each other, for example, an I/O 7 pin of the first pin group to an I/O 7 pin of the second pin group. Because the pin arrangement of each of the first and second pin groups may be line-symmetric, the third wirings 610 of the third module substrate 600 may be arranged parallel to each other in a vertical direction around the center line of line-symmetric pin arrangement. At least one of an I/O pin, NC pin, Vcc pin, Vss pin, and Wp pin of each of the first and second pin groups may be connected to each other by third wirings 610 that may be extended as a parallel line. The third wirings 610 extended in parallel may connect several chip groups to one wiring, and thus the wirings arrangement of the module substrate and the size and structure of the module substrate may be simplified.

Referring to FIG. 15, two semiconductor packages may be mounted on the third module substrate 600, and the semiconductor package arranged on the left side may include only non-defective semiconductor chips, and the semiconductor package on the right side may include defective semiconductor chips. A controller 650 may be connected to a R/B pin or CE pin. and may control the operation of chip groups connected to each of the first and second pin groups. Referring to FIG. 15, the second chip group of the semiconductor package may be arranged on the right side and may include a defective semiconductor chip, leads 152 of the second pin group may be connected to the second chip group which may not be connected to the controller 650. The controller 650 may control the operation of all semiconductor chips belonging to the first chip group and the second chip group with respect to the semiconductor package on the left side, and may control the operation of the semiconductor chips belonging to the first chip group with respect to the semiconductor package on the right side. Also, the I/O pin, NC pin, Vcc pin, Vss pin, and Wp pin of each of the first and second pin group may be connected to each other by wirings so that a NAND flash memory package may be accessed.

According to example embodiments not illustrated, when all chip groups are connected to the controller 650, the controller 650 may recognize chip groups to which defective semiconductor chips belong and may turn off the operation of these chip groups including the defective semiconductor chips.

Figure 16:
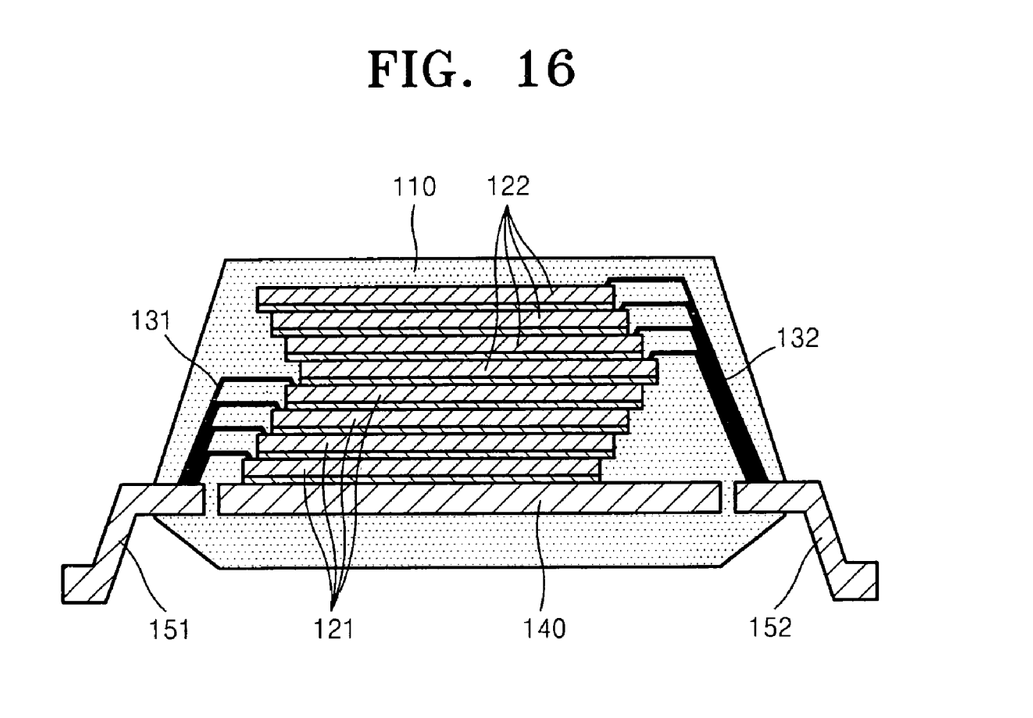
FIG. 16 is a side cross-sectional view of a semiconductor package in which semiconductor chips may be stacked stepwise on an upper surface of a lead frame, according to example embodiments.
Figure 17:
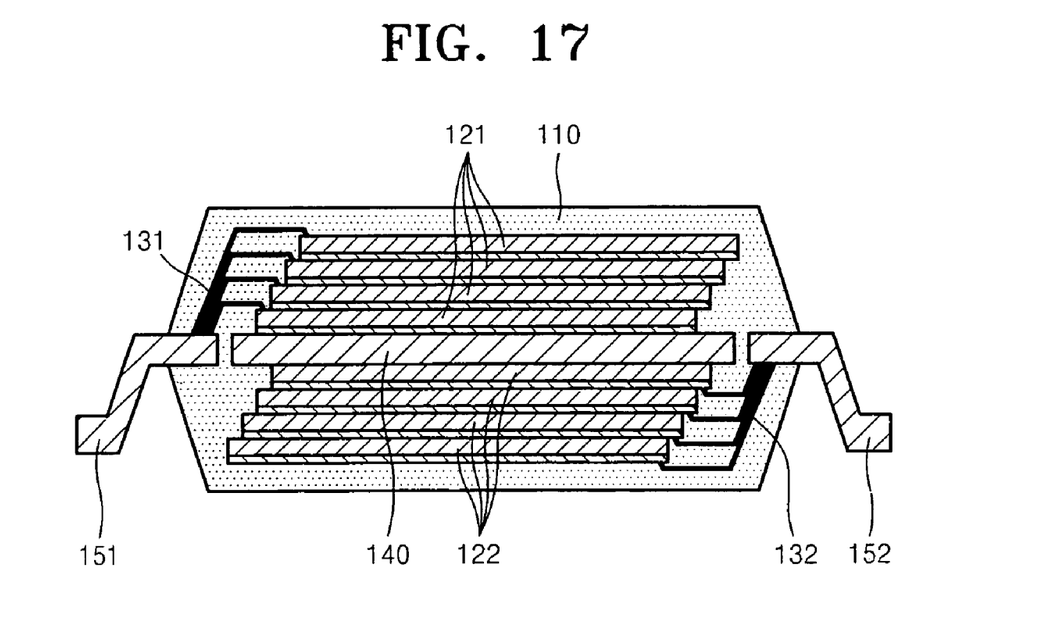
FIG. 17 is a side cross-sectional view of a semiconductor package in which semiconductor chips may be stacked stepwise on both surfaces of a lead frame, according to example embodiments.

FIG. 16 is a side cross-sectional view of a semiconductor package in which semiconductor chips 121 and 122 may be stacked stepwise on an upper surface of a lead frame 140, according to example embodiments; and FIG. 17 is a side cross-sectional view of a semiconductor package in which semiconductor chips 121 and 122 may be stacked stepwise on both surfaces of a lead frame 140, according to example embodiments. The semiconductor chips 121 and 122 may be stacked on one of an upper surface and a lower surface of the lead frame 140, or on both surfaces of the lead frame 140, if pads formed on the upper surface of predetermined or given semiconductor chips 121 and 122 are not covered by a lower surface of other semiconductor chips 121 and 122, the semiconductor chips 121 and 122 may be stacked stepwise or in a zigzag formation so that wire-bonding may be possible.

As described above, the semiconductor package according to example embodiments may include a plurality of leads that may be classified into a plurality of pin groups, and thus even if a semiconductor chip that is connected to a predetermined or given pin is defective, other semiconductor chips connected to other pins may be accessed, thereby increasing package yield.

Furthermore, a semiconductor package mounted on a module substrate may be rotated to align the positions of pins provided the pin arrangement is point-symmetric. Where the pin arrangement is line-symmetric, several semiconductor chips may be accessed by parallel wirings, and thus the size and structure of the module substrate may be simplified.

While example embodiments have been particularly shown and described with reference to example embodiments thereof, it will be understood by those of ordinary skill in the art that various changes in form and details may be made therein without departing from the spirit and scope of the following claims.

What is claimed is:

1. A semiconductor package comprising:
a conductive base having first and second major surfaces;
a first group of semiconductor chips stacked and mounted on the first major surface of the conductive base, the width of the semiconductor chips of the first group taken along a first direction parallel to the first major surface being less than a width of the first major surface taken along the first direction, each of the first group of semiconductor chips having same functional pads, the first group of semiconductor chips comprising at least four semiconductor chips;
a second group of semiconductor chips stacked and mounted on the second major surface of the conductive base, the width of the semiconductor chips of the second group taken along the first direction parallel to the second major surface being less than a width of the second major surface taken along the first direction, each of the second group of semiconductor chips having same functional pads, the second group of semiconductor chips comprising at least four semiconductor chips;
a first group of pins adjacent to one side of the conductive base and having no direct electrical connection with the conductive base;
a second group of pins adjacent to an opposite side of the one side of the conductive base and having no direct electrical connection with the conductive base, the first group of pins being line symmetric with the second group of pins with respect to a line having a second direction which is perpendicular to the first direction, and each pin of the first group of pins being line symmetric with a corresponding pin of the second group of pins having a same function with the corresponding pin of the second group of pins;
a first group of wires connected between the first of chip pads and the first group of pins, chip pads of the first group having same function and same relative location being connected to a same pin of the first group;
a second group of wires connected between the second group of chip pads and the second group of pins, chip pads of the second group having a same function and same relative location being connected to a same pin of the second group; and
an encapsulant encapsulating the conductive base and the semiconductor chips 2. The semiconductor package of claim 1, wherein the first and second group of pins consist of all pins at the one side and the opposite side, respectively, of the conductive base.

3. The semiconductor package of claim 1, wherein the first and second semiconductor chips are substantially the same.

4. The semiconductor package of claim 3, wherein the first and second semiconductor chips consist of all semiconductor chips of the semiconductor package.

5. The semiconductor package of claim 3, wherein an orientation of the second group of semiconductor chips is rotated 180 degrees with respect to an orientation of the first group of semiconductor chips along a line parallel to the second direction.

6. The semiconductor package of claim 1, wherein the semiconductor chips are stacked in a stepwise formation or in a zigzag formation.

7. The semiconductor package of claim 1, wherein each group of pins comprises an I/O pin, a CE pin, a Vcc pin and a Vss pin.

8. The semiconductor package of claim 1, wherein the package is a thin small outline package (TSOP) having two long sides and two short sides, wherein the first group of pins are disposed on one short side of the thin small outline package.

9. The semiconductor package of claim 1, wherein the uppermost chip of the first group of semiconductor chips extends past an edge of the conductive base as viewed from a third direction perpendicular to the first direction and second direction.

10. A semiconductor package module comprising:
a module substrate;
a first semiconductor package mounted on the module substrate, the first semiconductor package comprising:
a leadframe including a leadframe substrate having first and second major surfaces;
a first group of semiconductor chips stacked and mounted on the first major surface of the leadframe substrate, the width of the semiconductor chips of the first group taken along a first direction parallel to the first major surface being less than a width of the first major surface taken along the first direction, each of the first group of semiconductor chips having same functional chip pads, the first group of semiconductor chips comprising at least four semiconductor chips;
a second group of semiconductor chips stacked and mounted on the second major surface of the leadframe substrate, the width of the semiconductor chips of the second group taken along the first direction parallel to the second major surface being less than a width of the second major surface taken along the first direction, each of the second group of semiconductor chips having same functional chip pads, the second group of semiconductor chips comprising at least four semiconductor chips;

a first group of pins adjacent to one side of the leadframe substrate and having no direct electrical connection with the leadframe substrate;

a second group of pins adjacent to an opposite side of the one side of the leadframe substrate and having no direct electrical connection with the leadframe substrate, the first group of pins being line symmetric with the second group of pins with respect to a line having a second direction which is perpendicular to the first direction, and each pin of the first group of pins being line symmetric with a corresponding pin of the second group of pins having a same function with the corresponding pin of the second group of pins;

a first group of wires connected between the chip pads of the first group of semiconductor chips and the first group of pins, chip pads of the first group of semiconductor chips having a same function and same relative location being connected to a same pin of the first group of pins;

a second group of wires connected between the chip pads of the second group of semiconductor chips and the second group of pins, chip pads of the second group of semiconductor chips having a same function and same relative location being connected to a same pin of the second group of pins; and an encapsulant encapsulating the leadframe substrate and the semiconductor chips;

a first wiring formed on the module substrate connected to an I/O pin of the first group of pins and an I/O pin of the second group of pins, functions of the I/O pin of the first group of pins and the I/O pin of the second group of pins being the same and the locations of the I/O pin of the first group of pins and the I/O pin of the second group of pins being line symmetric with respect to the line having a second direction which is perpendicular to the first direction; and a second wiring formed on the module substrate connected to a pin of the first group of pins and not connected to any of the second group of pins.

11. The semiconductor package module of claim 10, further comprising a controller mounted on the module substrate and connected to the first wiring and the second wiring.

12. The semiconductor package of claim 11, wherein the pin of the first group connected to the second wiring is a CE pin.

13. The semiconductor package module of claim 12, further comprising a third wiring formed on the module substrate connected to a CE pin of the second group of pins and not connected to any of the first group of pins.

14. The semiconductor package module of claim 13, further comprising a fourth wiring formed on the module substrate and connected to another I/O pin of the first group of pins and another I/O pin of the second group of pins, the functions of the another I/O pin of the first group of pins and the another I/O pin of the second group of pins being the same and the locations of the another I/O pin of the first group of pins and the another I/O pin of the second group of pins being line symmetric with respect to the line having a second direction which is perpendicular to the first direction.

15. The semiconductor package module of claim 13, further comprising a second semiconductor package, the second semiconductor package having a structure substantially the same as the first semiconductor package, wherein third group of pins and fourth group of pins of the second semiconductor package respectively correspond to the first group of pins and second group of pins of the first semiconductor package, wherein the first wiring is connected to an I/O pin of the third group of pins and an I/O pin of the fourth group of pins, the functions of the I/O pin of the third group of pins and the I/O pin of the fourth group of pins being the same and the locations of the I/O pin of the third group of pins and the I/O pin of the fourth group of pins being line symmetric with respect to a line parallel to the line having a second direction which is perpendicular to the first direction.

16. The semiconductor package module of claim 15, wherein the first wiring is disposed under the first semiconductor package and the second semiconductor package.

17. The semiconductor package module of claim 16, further comprising a fifth wiring formed on the module substrate connected to a CE pin of the third group of pins and to the controller and not connected to any other of pins of packages of module.

18. The semiconductor package module of claim 17, further comprising a sixth wiring formed on the module substrate connected to a CE pin of the fourth group of pins and to the controller and not connected to any other of pins of packages of module.

19. The semiconductor package module of claim 15, wherein the second semiconductor package has a group of semiconductor chips judged to be defective.

20. The semiconductor package module of claim 15, further comprising a controller mounted on the package module to turn off operation of a group of semiconductor chips of the second semiconductor package.

21. The semiconductor package module of claim 13, further comprising a second semiconductor package, the second semiconductor package having a structure substantially the same as the first semiconductor package, wherein third group of pins and fourth group of pins of the second semiconductor package respectively correspond to the first group of pins and second group of pins of the first semiconductor package, wherein the first wiring is connected to an I/O pin of the third group of pins and an I/O pin of the fourth group of pins, the functions of the I/O pin of the third group of pins and the I/O pin of the fourth group of pins being the same and the locations of the I/O pin of the third group of pins and the I/O pin of the fourth group of pins being line symmetric with respect to a line corresponding to the line having a second direction which is perpendicular to the first direction.

22. The semiconductor package module of claim 11, wherein the controller is operable to control operations of the first semiconductor package if the first semiconductor package includes defective semiconductor chips.

23. The semiconductor package module of claim 11, wherein the second group of semiconductor chips of the first semiconductor package is defective.

24. A semiconductor package comprising:

a first chip group comprising a first semiconductor chip and a second semiconductor chip;

a second chip group comprising a third semiconductor chip and a fourth semiconductor chip;

a first set of package terminals, each of the first set of package terminals having an electrical connection to a pad of the first semiconductor chip and a pad of the second semiconductor chip which have a same function;

a second set of package terminals, each of the second set of package terminals having an electrical connection to a pad of the third semiconductor chip and a pad of the fourth semiconductor chip which have a same function;

a first chip enable package terminal electrically connected to a chip enable pad of the first semiconductor chip to provide access to the first semiconductor chip;

a second chip enable package terminal electrically connected to a chip enable pad of the second semiconductor chip to provide access to the second semiconductor chip;

a third chip enable package terminal electrically connected to a chip enable pad of the third semiconductor chip to provide access to the third semiconductor chip;

a fourth chip enable package terminal electrically connected to a chip enable pad of the fourth semiconductor chip to provide to access the fourth semiconductor chip.

25. The semiconductor package of claim 24, wherein the first set of package terminals is line symmetric with the second set of package terminals about a first line, and each terminal of the first set of terminals is line symmetric with a corresponding terminal of the second set of package terminals having a same function with the corresponding terminal of the second set of package terminals.

26. The semiconductor package of claim 25, wherein the first and second sets of package terminals consist of all package terminals of the semiconductor package.

27. The semiconductor package of claim 26, wherein an orientation of the second chip group is rotated 180 degrees with respect to an orientation of the first chip along a line parallel to the first line.

28. The semiconductor package of claim 24, wherein the semiconductor package is a thin small outline package (TSOP) having two long sides and two short sides, wherein the first set of package terminals are disposed on one short side of the thin small outline package.

29. The semiconductor package of claim 24, further comprising a base on which the first and second chip groups are mounted, wherein the uppermost chip of the first chip group extends past an edge of a base as viewed from a top down perspective.

30. The semiconductor package of claim 29, wherein the first and second chip groups are mounted on opposite sides of the base.

31. The semiconductor package of claim 24, wherein the first and second chip groups each comprise four semiconductor chips.

32. The semiconductor package of claim 24, wherein the first set of package terminals and the second set of package terminals are electrically unconnected within the semiconductor package.

33. A device comprising the semiconductor package of claim 32, further comprising electrical connections external to the package connecting package terminals of the first set of package terminals and terminals of the second set of package terminals having a same function.

34. The semiconductor package of claim 24, further comprising:

encapsulation encasing the first and second chip sets and defining an outer surface of the semiconductor package, wherein the first set of package terminals and the second set of package terminals are electrically unconnected within the encapsulation.

35. The semiconductor package of claim 24, wherein the first, second, third, and fourth chip enable package terminals are not connected to any other semiconductor chip other than the first, second, third and fourth semiconductor chips, respectively.

36. A semiconductor package comprising:

a first chip group comprising a plurality of semiconductor chips;

a second chip group comprising a plurality of semiconductor chips;

first package terminals;

second package terminals;

each of the semiconductor chips including chip pads to receive at least one of signals and external power supply voltages, wherein all semiconductor chips of the first chip group share first package terminals, chip pads of each of the semiconductor chips of the first group having signal or external power supply connections to respective same terminals of the first package terminals;

wherein all semiconductor chips of the second chip group share second package terminals, chip pads of each of the semiconductor chips of the second group having signal or external power supply connections to respective same terminals of the second package terminals;

wherein the first package terminals are electrically unconnected to the second package terminals within the semiconductor package;

wherein at least some of the chip pads of semiconductor chips of the first chip group are not electrically connected within the package to chip pads of other semiconductor chips of the first chip group; and wherein at least some of the chip pads of semiconductor chips of the second chip group are not electrically connected within the package to chip pads of other semiconductor chips of the second chip group.

37. The semiconductor package of claim 36, wherein chip enable chip pads of semiconductor chips of the first chip group are not electrically connected within the package to chip enable chip pads of other semiconductor chips of the first chip group; and wherein chip enable chip pads of semiconductor chips of the second chip group are not electrically connected within the package to chip enable chip pads of other semiconductor chips of the second chip group.

38. The semiconductor package of claim 36, wherein each semiconductor chip of the semiconductor package has electrical connections to package terminals unique to the semiconductor chip.

39. The semiconductor package of claim 36, wherein each semiconductor chip of the semiconductor package has chip enable connections to package terminals unique to the semiconductor chip.

* * * * *